(12) United States Patent
Kula et al.

(10) Patent No.: US 9,284,640 B2
(45) Date of Patent: Mar. 15, 2016

(54) METHOD OF PRODUCING GRAPHENE FROM LIQUID METAL

(71) Applicants: Piotr Kula, Lodz (PL); Antoni Rzepkowski, Lodz (PL); Robert Pietrasik, Brzeziny (PL); Radomir Atraszkiewicz, Lodz (PL); Konrad Dybowski, Lodz (PL); Wojciech Modrzyk, Zielona Gora (PL)

(72) Inventors: Piotr Kula, Lodz (PL); Antoni Rzepkowski, Lodz (PL); Robert Pietrasik, Brzeziny (PL); Radomir Atraszkiewicz, Lodz (PL); Konrad Dybowski, Lodz (PL); Wojciech Modrzyk, Zielona Gora (PL)

(73) Assignees: ADVANCED GRAPHENE PRODUCTS SP. Z.O.O., Zielona Gora (PL); POLITECHNIKA LODZKA, Lodz (PL)

( * ) Notice: Subject to any disclaimer, the term of this patent is extended or adjusted under 35 U.S.C. 154(b) by 139 days.

(21) Appl. No.: 14/069,731

(22) Filed: Nov. 1, 2013

(65) Prior Publication Data

US 2015/0122659 A1    May 7, 2015

(51) Int. Cl.
  C25D 21/02    (2006.01)
  C23C 14/35    (2006.01)
  C25D 5/48     (2006.01)
  C25D 7/00     (2006.01)
  C23C 16/00    (2006.01)
  C23C 16/01    (2006.01)
  C23C 16/26    (2006.01)
  C01B 31/04    (2006.01)

(52) U.S. Cl.
  CPC ............ *C23C 14/35* (2013.01); *C01B 31/0453* (2013.01); *C23C 16/003* (2013.01); *C23C 16/01* (2013.01); *C23C 16/26* (2013.01); *C25D 5/48* (2013.01); *C25D 7/00* (2013.01); *C01B 2204/32* (2013.01)

(58) Field of Classification Search
  CPC .......... C25D 21/02; C25D 21/04; C25D 3/38; C23C 14/35
  See application file for complete search history.

(56) References Cited

U.S. PATENT DOCUMENTS

| 2009/0155561 A1 | 6/2009 | Choi |
| 2010/0055464 A1 | 3/2010 | Sung |
| 2010/0255984 A1 | 10/2010 | Sutter et al. |
| 2011/0033688 A1 | 2/2011 | Veerasamy |

(Continued)

FOREIGN PATENT DOCUMENTS

| EP | 2 392 547 A2 | 12/2011 |
| EP | 2 865 646 A1 | 4/2015 |

OTHER PUBLICATIONS

Srivastava, Anchal, et al., "Novel Liquid Precursor-Based Facile Synthesis of Large-Area Continuous, Single, and Few-Layer Graphene Films". Chemistry of Materials 2010, 22 3457-3461.*

(Continued)

*Primary Examiner* — Bret Chen
(74) *Attorney, Agent, or Firm* — Oliff PLC

(57) ABSTRACT

A method for producing a graphene layer on a multilayered plate containing, as the graphene forming matrix, an external layer composed of a metal or a metal alloy and, as a support substrate, the transition metals and/or their alloys and/or metalloids and/or their solutions and compounds, the method involving subjecting the multilayered plate to heat treatment in the following stages: plate heating until the plate reaches a temperature that is between 0.5° C. and 50° C., annealing, at a constant or variable temperature from the temperature range, for a period between 60 and 600 seconds and cooling, with the cooling rate maintained between 0.1 and 2° C./min in the temperature range of 1,200° C.-1,050° C.

6 Claims, 1 Drawing Sheet

Figure 1:
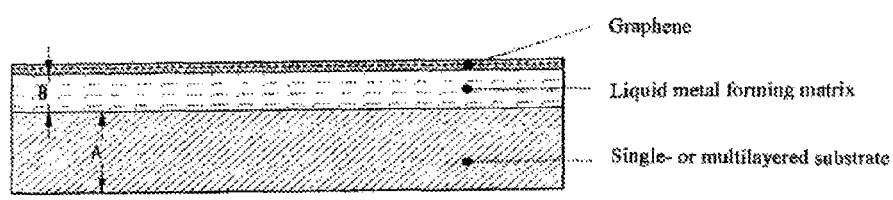

A – thickness of the liquid metal forming matrix
B – thickness of the single- or multilayered substrate

(56) References Cited

U.S. PATENT DOCUMENTS

| | | | |
|---|---|---|---|
| 2011/0108609 A1 | 5/2011 | Woo et al. | |
| 2011/0206934 A1 | 8/2011 | Bol et al. | |
| 2012/0082787 A1 | 4/2012 | Fujita | |
| 2012/0241069 A1* | 9/2012 | Hofmann et al. | 156/60 |
| 2012/0269717 A1* | 10/2012 | Radhakrishnan et al. | 423/448 |
| 2014/0121132 A1* | 5/2014 | Cerf et al. | 506/16 |
| 2015/0125694 A1* | 5/2015 | Kula et al. | 423/448 |

OTHER PUBLICATIONS

Gtandthyll, Samuel, et al., "Epitaxial growth of graphene on transitional metal surfaces: chemical vapor deposition versus liquid phase deposition". J. Phys.: Condens. Matter 24 (2012) 314204, pp. 1-15.*

Bautista, C., et al., "Multilayer Graphene Synthesized by CVD Using Liquid Hexane as the Carbon Precursor". Citation unknown, pp. 1-6.*

Piotr Kula et al., "The growth of a polycrystalline graphene from a liquid phase," NSTI-Nanotech 2013, vol. 1, pp. 210-212.

Dechao Geng et al., "Uniform hexagonal graphene flakes and films grown on liquid copper surface," PNAS, May 22, 2012, vol. 109, No. 21, pp. 7992-7996.

Mar. 10, 2014 European Search Report issued in Application No. 13 00 5122.

Mar. 10, 2014 Written Opinion issued in Application No. 13 00 5122.

* cited by examiner

A — thickness of the liquid metal forming matrix
B — thickness of the single- or multilayered substrate

METHOD OF PRODUCING GRAPHENE FROM LIQUID METAL

CROSS REFERENCE TO RELATED APPLICATIONS

This application relies on the Polish Patent Application No. P.399096, filed May 4, 2012.

FIELD OF THE INVENTION

The present invention relates to a method for producing graphene from a liquid metal.

BACKGROUND OF THE INVENTION

Graphene, as one of the allotropic forms of carbon, is regarded as the final element of the series of polycyclic aromatic hydrocarbons. Graphene is composed of a monolayer of carbon atoms arranged in hexagonal rings which are linked to one another. Since the material is just one-atom thick, the form is referred to as a two-dimensional structure of carbon atoms packed into a hexagonal lattice. The length of the carbon-carbon bonds is ca. 1.42 Å. Carbon atoms in graphene form a flat, practically two-dimensional lattice with hexagonal cells, resembling a honeycomb pattern.

There are known graphene production methods which make use of the liquid state for graphene formation but are not based on the variable decreasing solubility of carbon in the liquid state. The method outlined in the patent application no. US 2012/0082737 relates to the formation of a graphene layer using liquid gallium. According to the method, an amorphous carbon film produced by vapour-depositing on an organic film is then transferred to a substrate of liquid gallium (or, alternatively, indium, tin or antimony), forming a graphene layer as a result of the graphitization reaction arising at the contact interface between the solid phase and the liquid phase. The other known method, presented in the patent description no. US2010/0055464, consists in that an eutectic mixture containing pure graphite and a solvent selected from Ni, Cr, Mn, Fe, Co, Ta, Pd, Pt, La and Ce releases, in the process of crystallization, graphite which is then separated into individual graphene layers. To this aim, a graphite disc is placed on a plate made, for example, of pure nickel, heated to 1,500° C. for 30-60 min, vacuum annealed at a pressure of $1.33^{-5}$ mbar and then cooled down slowly.

Known are also methods based on the epitaxial growth of graphene from the gaseous phase on substrates composed of metals, alloys and intermetallic phases with mono- or polycrystalline structures. The transport of carbon into the graph layer often makes use of the variable solubility of carbon, decreasing along with temperature, in the solid state forming matrix.

Known from the patent description no. US 2011/0108609 is a method of fabricating graphene in which a layer including nickel (Ni) or a nickel-based alloy containing at least one metal from the group comprising copper (Cu), iron (Fe), gold (Au) and platinum (Pt) is saturated with carbon. Nickel-based alloys contain between 5 and 30 atomic % of Ni. The role of alloy additives is to restrict the solubility of carbon in Ni. The catalyst layer is applied in the process of evaporation to a silicon substrate coated with silica ($SiO_2$/Si). Stacked catalyst layers can be obtained by sputtering, evaporation or the CVD method, or by alternately stacking thin metal films atop one another, followed by annealing. The thickness of the layers varies from ca. 10 to ca. 1,000 nm. In order to produce a graphene layer, hydrocarbons are supplied into the processing chamber containing a previously applied catalyst layer. Argon may also be supplied with the hydrocarbons as a carrier gas. The ratio of the mixture containing a carbon-carrying gas (usually acetylene) and argon is 1:40. During the formation of the graphene layer the temperature of the substrate can be in the range of 650° C.÷750° C. The graphene layer is produced as a result of variable carbon solubility in the catalyst material of the substrate.

Known from the patent description no. US 2009/0155561 is a method which comprises placing a carbon material directly on a catalyst layer which, as a result of heat treatment, undergoes thermal decomposition thus becoming a source of carbon atoms for infiltrating the catalyst layer. The carbonaceous material covering the catalyst layer can be a polymer applied to the surface using a variety of coating or immersion methods or other techniques in order to create a uniform layer. The thickness of the graphene sheet produced in this manner can be controlled by the molecular weight and the quantity of applied polymer. The next stage involves heat treatment in an inert or reducing atmosphere in order to achieve thermal decomposition of the polymer. As an alternative to placing a carbonaceous material on the surface of the catalyst layer, the catalyst layer can be contacted directly with a gaseous carbon source which, according to the patent's claim, can include a compound from the group comprising carbon monoxide, ethane, ethylene, ethanol, acetylene, propane, propylene, butane, butadiene, pentane, pentene, cyclopentadiene, hexane, cyclohexane, benzene, toluene and their combinations. Carbon atoms infiltrate the catalyst layer until the solubility limit is achieved, which is when graphene nucleation occurs and graphene grows forming individual graphene sheets. A significant element of the processes is the cooling method. Catalyst layers can have a single-crystal structure and comprise a metal selected from the group consisting of Ni, Co, Fe, Pt, Au, Al, Cr, Cu, Mg, Mn, Mo, Rh, Si, Ta, Ti, W, U, V, Zr or alloys containing at least one of the foregoing metals. Since the catalyst layer is monocrystalline, it resolves the problem of defects which occurs in polycrystalline catalysts. The catalyst layer can be used on its own or, as in other methods, disposed on a silicon substrate. The method is suitable for producing between 1 and ca. 300 layers, each single layer measuring between ca. 1 mm and ca. 1,000 mm.

Yet another method disclosed in the patent application no. US 2010/0255984 involves the process of carbonization of ruthenium (Ru) as a mono- or polycrystalline substrate deposited epitaxially with a plane (0001) having a hexagonal crystalline structure matched to that of the emerging graphene. According to the method, the substrate is heated to a temperature of ca. 0.5 Ttop., under reduced pressure, maintained at that temperature for several up to several dozen seconds, and then annealed in an atmosphere of ethylene at $10^{-5}$ mbar, following which Ru is cooled down to a temperature of 0.3÷0.4 Ttop. at a rate of 20° C./min or lower.

The patent description no. US 2011/0033688 discloses the process of graphene growth from a gaseous phase containing acetylene or methane with argon (as a carrier gas). Similarly to the methods reported above, the catalyst is a thin layer of metal, suitable metals including nickel, cobalt, iron, copper or metal alloys (e.g. iron-nickel, nickel-chromium) applied to the substrate. The catalyst layer has an oriented polycrystalline structure with large grains, ca. 10 µm in size. The process involves the stage of heating the substrate to 800÷900° C. in a carbon-rich atmosphere at a pressure of 5÷150 mbar, followed by sudden cooling. Cooling is performed with an inert gas, to the temperature level of 700° C. or lower.

Known from the patent description no, EP 2 392 547 is a method based on graphene growth from the gaseous phase on a SiC (silicon carbide) substrate, characterized in that the process of silicon sublimation from the substrate is controlled with the flow of an inert gas—argon (or a gas other than inert) through the epitaxial reactor. The flow rate of the inert gas ranges from 6 l/min (or less) to 70 l/min at a pressure of $10^{-4}$ mbar. The substrate becomes heated to over 1,100° C. during the process. The epitaxy is preceded by a stage of etching in the atmosphere of gas containing hydrogen. It may also additionally contain propane, silane or their mixtures, or other hydrocarbons. The process is conducted at various temperatures within the 1,400° C.÷2,000° C. range and at a pressure of 10÷1,000 mbar.

The patent description no. US 2011/0206934 presents a method for producing an appropriate multilayered structure, with one of the layers constituting a source of carbon atoms. The substrate is composed of silicon coated with silica, to which amorphous carbon is applied by ion sputtering, and then hydrogenated. Alternatively, the layer comprises a metal-carbon alloy containing at least 50 atomic percent of carbon, and has a thickness in the range from 0.5 nm to 50 nm. As the next stage, a second layer composed of a metal (Co, Cu, Fe, Ir, Mo, Ni, Pd, Pt, Ru or their alloys), between 10 and 1,000 nm thick, is applied to the first layer, e.g. using the PVD method. The multilayered structure is then annealed at the temperature range of 550° C.÷1,400° C. in the atmosphere of $Ar/H_2$ and $N_2/H_2$, $N_2$, Ar, He or in a vacuum. In this way, carbon infiltrates the metal layer, leading to the deposition of graphene.

All the currently known methods of graphene production utilize substrates, catalyst layers (graphene forming matrices) in the solid state.

NATURE OF THE INVENTION

The essence of the graphene production method according to the present invention consists in that a multilayered plate containing, as the graphene forming matrix, an external layer composed of a metal or a metal alloy with a melting point in the range from 1,051° C. and 1,150° C. and, as a substrate, between 1 and 5 layers made of transition metals and/or their alloys and/or metalloids and/or their solutions and compounds with melting points in the range from 1,151° C. to 3,410° C., is heated, as the first stage, until the plate reaches a temperature that is between 0.5° C. and 50° C. higher than the melting point of the forming matrix, at which point, as the second stage, it is annealed at a constant or variable temperature from the same range for a period ranging from 60 to 600 seconds, with a concurrent supply of gases into the atmosphere—acetylene at a partial pressure of between 0 and 4 hPa, ethylene at a partial pressure of between 0 and 4 hPa and hydrogen at a partial pressure of between 0 and 2 hPa, for 10-300 seconds, whereupon, as the third stage, the plate is cooled down maintaining the cooling rate of 0.1-2° C./mm within the temperature range from 1,200° C. to 1,050° C., where consecutive stages of heating, annealing and cooling are performed in the atmosphere of pure argon at a constant partial pressure varying from 1 hPa to 1,100 hPa.

Advantageously, the external metal layer is made of copper.

It is also advantageous for the graphene-forming external layer composed of a metal or a metal alloy to be between 500 and 500,000 nm thick.

It is furthermore advantageous than the transition metals are selected from the group comprising platinum, palladium and nickel.

It is also advantageous that the metalloids or their compounds are selected from silicon or quartz.

In particular, it is advantageous that the platinum plate, which is at least 0.2 mm thick and coated by electrolysis on one side with a 0.2 mm thick copper layer, is placed in the chamber of a vacuum furnace, at which point, after removing air from the chamber to the vacuum level of $10^{-3}$ hPa, argon is supplied into the furnace chamber in such a way as to maintain the partial pressure of argon throughout the entire process at the level of 20 hPa, whereby concurrently with the commencement of argon supply the plate heating process is initiated and continued until the plate reaches 1,100° C. and the temperature of the plate stabilizes at this level for 2.5 min, with acetylene, ethylene, hydrogen and argon additionally supplied into the furnace chamber for 60 seconds during the period of maintaining constant temperatures until the partial pressure reaches 28 hPa, following which the plate is cooled down at a rate of 1° C./min to 1,075° C., at which point rapid uncontrolled cooling to the ambient temperature is continued in the furnace chamber.

In particular, it is likewise advantageous that a molybdenum plate with a thickness of 4.5 mm and dimensions of 50×50 mm is coated by magnetron sputtering with a 40 μm thick layer of nickel and then a 1.5 mm thick layer of copper and is placed in the chamber of a vacuum furnace, at which point, after removing air from the chamber to the vacuum level of $10^{-3}$ hPa, argon is supplied into the furnace chamber in such a way as to maintain the partial pressure of argon throughout the entire process at the level of 1,000 hPa, whereby at the same time the plate heating process is initiated and continued until the plate reaches 1,100° C. and then temperature of the plate stabilizes at this level for 10 minutes, with additional hydrogen supplied into the furnace chamber for 120 seconds during the period of heating to the temperature to achieve the partial pressure of 60 hPa, following which the plate is cooled down at a rate of 0.2° C./min to 1,050° C., at which point rapid uncontrolled cooling to the ambient temperature is continued in the furnace chamber.

In particular, it is also advantageous that the quartz glass plate, which is at least 0.8 mm thick and coated with a 300 nm thick layer of silicon and a 1,000 nm thick layer of copper, is placed in the chamber of a vacuum furnace, at which point, after removing air from the chamber to the vacuum level of $10^{-3}$ hPa, argon is supplied into the furnace chamber in such a way as to maintain the partial pressure of argon throughout the entire process at the level of 50 hPa, whereby after 5 minutes the plate heating process is initiated and continued until the plate reaches 1,090° C. and the temperature of the plate stabilizes at this level for 5 minutes, with additional gases supplied into the furnace chamber for 20 seconds during the period of maintaining constant temperature, including acetylene—to achieve the partial pressure of 2 hPa, ethylene—to reach the partial pressure of 2 hPa and hydrogen—to attain the partial pressure of 1 hPa, following which the plate is cooled down at a rate of 0.2° C./min to 1,075° C., at which point rapid uncontrolled cooling to the ambient temperature is continued in the furnace chamber.

DETAILED DESCRIPTION OF THE INVENTION

Figure 2:
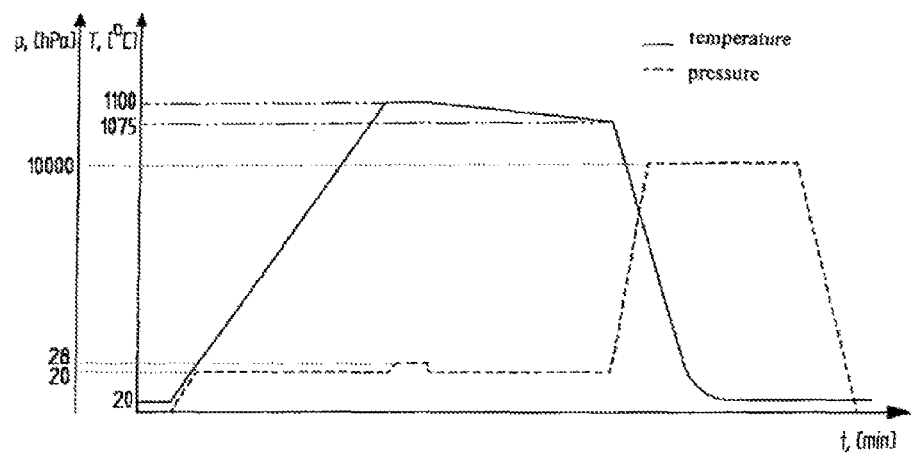

The invention will be described in more detail below in conjunction with examples and a drawing in which individual figures illustrate:

FIG. 1—cross-section of the structure of a multi-layer plate containing a graphene-forming matrix in the form of an outer layer consisting of a metal or a metal alloy and a support substrate layer, and FIG. 2—diagram illustrating consecutive steps of the thermal process and gas supply.

EXAMPLE 1

A platinum plate, 0.3 mm thick and measuring 10×40 mm, was coated by electrolysis on one side with a 0.2 mm thick layer of copper. The two-layer plate thus prepared was placed in the chamber of a vacuum furnace, following which air was removed from the chamber to achieve the vacuum level of $10^{-3}$ hPa. As the next step, argon was supplied into the furnace chamber to maintain the partial pressure of argon at the level of 20 hPa throughout the entire process. Concurrently with the commencement of argon supply into the chamber the process of plate heating was initiated and maintained until the temperature reached 1,100° C. at which point the temperature of the plate was stabilized at this level for 2.5 min. As the temperature was maintained at a constant level, acetylene, ethylene, hydrogen and argon were additionally supplied into the furnace chamber for 60 seconds until the partial pressure of 28 hPa was attained. The plate cooling process was then commenced, at a rate of 1° C./min, to the temperature of 1,075° C., followed by rapid uncontrolled cooling to the ambient temperature in the furnace chamber. A polycrystalline monolayer of graphene with a grain size ranging from 100 to 120 µm was ultimately identified on the copper surface. A polymethyl methacrylate film was attached to the surface of the plate and copper was selectively etched from the space between platinum and PMTM, producing a polycrystalline graphene sheet measuring 10×40 mm.

EXAMPLE 2

A molybdenum plate, 4.5 mm thick and measuring 50×50 mm, was coated by magnetron sputtering with a 40 µm thick layer of nickel, followed by a 1.5 mm thick layer of copper. The three-layer plate thus prepared was placed in the chamber of a vacuum furnace, following which air was removed from the chamber to achieve the vacuum level of $10^{-3}$ hPa. As the next step, argon was supplied into the furnace chamber to maintain the partial pressure of argon at the level of 1100 hPa throughout the entire process. At the same time the process of plate heating was initiated and maintained until the temperature reached 1,100° C., at which point the temperature of the plate was stabilized at this level for 10 minutes. While heating to the temperature additional hydrogen was supplied into the furnace chamber for 120 seconds to achieve the partial pressure of 60 hPa. The plate cooling process was then commenced, at a rate of 0.2° C./min, to the temperature of 1,050° C., followed by rapid uncontrolled cooling to the ambient temperature in the furnace chamber. A polycrystalline monolayer of graphene with a grain size ranging from 100 to 120 µm was ultimately identified on the copper surface. A polymethyl methacrylate film was attached to the surface of the plate and copper was selectively etched from the space between platinum and PMTM, producing a polycrystalline graphene sheet measuring 40×40 atm.

EXAMPLE 3

A plate of quartz glass, 2 mm thick and measuring 15×40 mm, was coated by magnetron sputtering with a 300 nm thick layer of silicon, followed by a 1,000 nm thick layer of copper. The three-layer plate thus prepared was placed in the chamber of a vacuum furnace, following which air was removed from the chamber to achieve the vacuum level of $10^{-3}$ hPa. As the next step, argon was supplied into the furnace chamber to maintain the partial pressure of argon at the level of 50 hPa throughout the entire process. After 5 minutes the process of plate heating was initiated and maintained until the temperature reached 1,090° C., at which point the temperature of the plate was stabilized at this level for 5 minutes. As the temperature was maintained at a constant level, additional gases were supplied into the furnace chamber for 20 seconds: acetylene—to achieve the partial pressure of 2 hPa, ethylene—to reach the partial pressure of 2 hPa and hydrogen—to attain the partial pressure of 1 hPa. The plate cooling process was then commenced, at a rate of 0.2° C./min, to the temperature of 1,075° C., followed by rapid uncontrolled cooling to the ambient temperature in the furnace chamber. A polycrystalline monolayer of graphene with a grain size ranging from 200 to 220 µm was ultimately identified on the copper surface. A polymethyl methacrylate film was attached to the surface of the plate and flat pressure was exerted on the plate to crush the quartz glass substrate, following which copper was solubilized in 1N nitric acid. A polycrystalline graphene sheet measuring 15×40 mm was obtained in the process.

The invention claimed is:

1. A method for producing a graphene layer from a liquid metal matrix on a solid metal or ceramic substrate, wherein a multilayered plate containing, as the graphene forming matrix, an external layer composed of a metal or a metal alloy with a melting point in the range from 1,051° C. and 1,150° C. and, as a support substrate, between 1 and 5 layers made of transition metals and/or their alloys and/or metalloids and/or their solutions and compounds with melting points in the range from 1,151° C. to 3,410° C., is subjected to heat treatment in the following stages:

plate heating until the plate reaches a temperature that is between 0.5° C. and 50° C. higher than the melting point of the forming matrix, annealing, at a constant or variable temperature from the temperature range, for a period between 60 and 600 seconds, concurrently supplying the atmosphere with acetylene at a partial pressure of up to 4 hPa, ethylene at a partial pressure of up to 4 hPa and hydrogen at a partial pressure of up to 2 hPa for a period between 10 and 300 seconds, cooling, partially controlled, with the cooling rate maintained between 0.1 and 2° C./min in the temperature range of 1,200° C.-1,050° C., where consecutive stages of heating, annealing and cooling are conducted in the atmosphere of pure argon at a constant partial pressure varying from 1 hPa to 1,100 hPa, wherein the transition metal is selected from the group consisting of platinum, molybdenum, palladium and nickel, and (1) when the transition metal is platinum, the platinum plate, which is at least 0.2 mm thick and coated by electrolysis on one side with a 0.2 mm thick copper layer, is placed in the chamber of a vacuum furnace, at which point, after removing air from the chamber to the vacuum level of $10^{-3}$ hPa, argon is supplied into the furnace chamber in such a way as to maintain the partial pressure of argon throughout the entire process at the level of 20 hPa, whereby concurrently with the commencement of argon supply the plate heating process is initiated and continued until the plate reaches 1,100° C. and the temperature of the plate stabilizes at this level for 2.5 min, with acetylene, ethylene, hydrogen and argon additionally supplied into the furnace chamber for 60 seconds during the period of maintaining constant temperature until the partial pressure reaches 28 hPa, following which the plate is cooled down at a rate of 1°

C./min to 1,075° C., at which point rapid uncontrolled cooling to the ambient temperature is continued in the furnace chamber, (2) when the transition metal is molybdenum, a molybdenum plate with a thickness of 4.5 mm and dimensions of 50×50 mm is coated by magnetron sputtering with a 40 μm thick layer of nickel and then a 1.5 mm thick layer of copper and is placed in the chamber of a vacuum furnace, at which point, after removing air from the chamber to the vacuum level of $10^{-3}$ hPa, argon is supplied into the furnace chamber in such a way as to maintain the partial pressure of argon throughout the entire process at the level of 1100 hPa, whereby at the same time the plate heating process is initiated and continued until the plate reaches 1,100° C. and then temperature of the plate stabilizes at this level for 10 minutes, with additional hydrogen supplied into the furnace chamber for 120 seconds during the period of heating to the temperature to achieve the partial pressure of 60 hPa, following which the plate is cooled down at a rate of 0.2° C./min to 1,050° C., at which point rapid uncontrolled cooling to the ambient temperature is continued in the furnace chamber, and wherein the metalloid or its compound is silicon or quartz, and when the metalloid or its compound is quartz, a quartz glass plate, which is at least 0.8 mm thick and coated with a 300 nm thick layer of silicon and a 1,000 nm thick layer of copper, is placed in the chamber of a vacuum furnace, at which point, after removing air from the chamber to the vacuum level of $10^{-3}$ hPa, argon is supplied into the furnace chamber in such a way as to maintain the partial pressure of argon throughout the entire process at the level of 50 hPa, whereby after 5 minutes the plate heating process is initiated and continued until the plate reaches 1,090° C. and the temperature of the plate stabilizes at this level for 5 minutes, with additional gases supplied into the furnace chamber for 20 seconds during the period of maintaining constant temperature: acetylene—to achieve the partial pressure of 2 hPa, ethylene—to reach the partial pressure of 2 hPa and hydrogen—to attain the partial pressure of 1 hPa, following which the plate is cooled down at a rate of 0.2° C./min to 1,075° C., at which point rapid uncontrolled cooling to the ambient temperature is continued in the furnace chamber.

2. The method according to claim 1, wherein the external metal layer is made of copper.

3. The method according to claim 1, wherein the graphene-forming external layer of metal or metal alloy is between 500 and 500,000 nm thick.

4. The method according to claim 1, wherein the support substrate is made of platinum.

5. The method according to claim 1, wherein the support substrate is made of molybdenum.

6. The method according to claim 1, wherein the support substrate is made of quartz.

* * * * *